United States Patent
G et al.

(10) Patent No.: US 11,824,550 B2
(45) Date of Patent: Nov. 21, 2023

(54) SCHEDULING ANALOG-TO-DIGITAL CONVERSIONS

(71) Applicant: Texas Instruments Incorporated, Dallas, TX (US)

(72) Inventors: Anand Kumar G, Bengaluru (IN); Srinivasa B S Chakravarthy, Bangalore (IN); Aniruddha Periyapatna Nagendra, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 23 days.

(21) Appl. No.: 17/565,797

(22) Filed: Dec. 30, 2021

(65) Prior Publication Data

US 2023/0098382 A1   Mar. 30, 2023

(30) Foreign Application Priority Data

Sep. 28, 2021   (IN) .............................. 202141043921

(51) Int. Cl.
*H03M 1/12* (2006.01)
(52) U.S. Cl.
CPC ....... *H03M 1/1225* (2013.01); *H03M 1/1245* (2013.01)
(58) Field of Classification Search
CPC .......................... H03M 1/1225; H03M 1/1245

USPC .................................................. 341/141, 155
See application file for complete search history.

(56) References Cited

U.S. PATENT DOCUMENTS

| | | | |
|---|---|---|---|
| 8,629,796 B1* | 1/2014 | Jouin | H03M 1/0624 455/1 |
| 9,793,910 B1* | 10/2017 | Devarajan | H03M 1/124 |
| 2014/0089536 A1* | 3/2014 | Pedersen | H03M 1/1215 710/22 |

* cited by examiner

*Primary Examiner* — Peguy Jean Pierre
(74) *Attorney, Agent, or Firm* — Mandy Barsilai Fernandez; Frank D. Cimino

(57) ABSTRACT

A method is provided. In some examples, the method includes receiving, at a sequencer circuit of an analog-to-digital converter (ADC), a first request to perform a first conversion. In addition, the method includes determining, by the sequencer circuit, that the ADC is not busy. The method further includes responsive to determining that the ADC is not busy, and by the sequencer circuit, causing the ADC to perform the first conversion. The method also includes receiving, at the sequencer circuit, a second request to perform a second conversion. The method includes determining, by the sequencer circuit, that the ADC is busy and, responsive to determining that the ADC is busy, and by the sequencer circuit, waiting to cause the ADC to perform the second conversion.

20 Claims, 7 Drawing Sheets

SCHEDULING ANALOG-TO-DIGITAL CONVERSIONS

CROSS-REFERENCE TO RELATED APPLICATIONS

This application claims the benefit of Indian Provisional Patent Application No. 202141043921, filed Sep. 28, 2021, the entire content being incorporated herein by reference.

BACKGROUND

An analog-to-digital converter (ADC) may have multiple input channels, where each channel is coupled to a respective circuit that produces an analog circuit. The input channels may feed into an input multiplexer that selects one of the channels for conversion. The ADC may also include a sequencer circuit that controls scheduling of conversions across the ADC channels. The sequencer circuit can schedule operations such as repeat conversions on a single channel or a scan of multiple channels.

SUMMARY

In some examples, a method includes receiving, at a sequencer circuit of an analog-to-digital converter (ADC), a first request to perform a first conversion. In addition, the method includes determining, by the sequencer circuit, that the ADC is not busy. The method further includes responsive to determining that the ADC is not busy, and by the sequencer circuit, causing the ADC to perform the first conversion. The method also includes receiving, at the sequencer circuit, a second request to perform a second conversion. The method includes determining, by the sequencer circuit, that the ADC is busy and, responsive to determining that the ADC is busy, and by the sequencer circuit, waiting to cause the ADC to perform the second conversion.

In further examples, a device includes an internal channel and an ADC including an analog circuit coupled to the internal channel and configured to receive a first analog signal via the internal channel. In addition, the ADC includes a sequencer circuit coupled to the analog circuit and configured to receive a request to perform a first conversion of the first analog signal. The sequencer circuit is also configured to determine whether the analog circuit is busy and, responsive to determining that the analog circuit is not busy, cause the analog circuit to perform the first conversion. The sequencer circuit is further configured to, responsive to determining that the analog circuit is busy, wait to cause the analog circuit to perform the first conversion.

In yet further examples, a device includes a node configured to couple to an external sensor. In addition, the device includes an internal channel and an analog-to-digital converter (ADC) including a multiplexer including a first data input coupled to the node. The multiplexer also includes a second data input coupled to the internal channel, and the multiplexer further includes an output. The ADC includes a sample and hold circuit including an input coupled to the output of the multiplexer, where the sample and hold circuit also includes a sample-trigger line and an output. The ADC further includes a conversion logic circuit including an input coupled to the output of the sample and hold circuit. The conversion logic circuit also includes a conversion-mode line, a conversion-done line, a reset line, and an output; a result register coupled to the output. The ADC includes a sequencer circuit coupled to the sample-trigger line, the conversion-mode line, the conversion-done line, the reset line.

BRIEF DESCRIPTION OF THE DRAWINGS

Features of the present invention may be understood from the following detailed description and the accompanying drawings. In that regard.

DETAILED DESCRIPTION

Specific examples are described below in detail with reference to the accompanying figures. It is understood that these examples are not intended to be limiting, and unless otherwise noted, no feature is required for any particular example. Moreover, the formation of a first feature over or on a second feature in the description that follows may include examples in which the first and second features are formed in direct contact and examples in which additional features are formed between the first and second features, such that the first and second features are not in direct contact.

A device may include an analog-to-digital converter (ADC) configured to perform conversions of analog signals originating from multiple input channels. The multiple input channels may include channels coupled to internal circuits, such as power supply lines, battery terminals, a temperature sensor, and/or auxiliary circuits. The multiple input channels may also include channels that are coupled to external nodes (e.g., pins or pads) on the device, where each node may be coupled to an external sensor or another external circuit once the device is installed and operational.

The ADC may include a sequencer circuit for scheduling the conversion of analog signals originating from the multiple input channels. For example, the sequencer circuit may be configured to cause the ADC to perform scheduled conversions on a particular channel (e.g., a channel connected to an external sensor). During a gap between scheduled conversions, the ADC may be able to perform an ad hoc single conversion (ASC) operation on an analog signal originating from another channel, such as an internal channel. By scheduling the ASC operations during gaps between scheduled conversions, the sequencer circuit can increase the throughput of the ADC. Of course, these advantages are merely examples, and no advantage is required for any particular embodiment.

Figure 1:
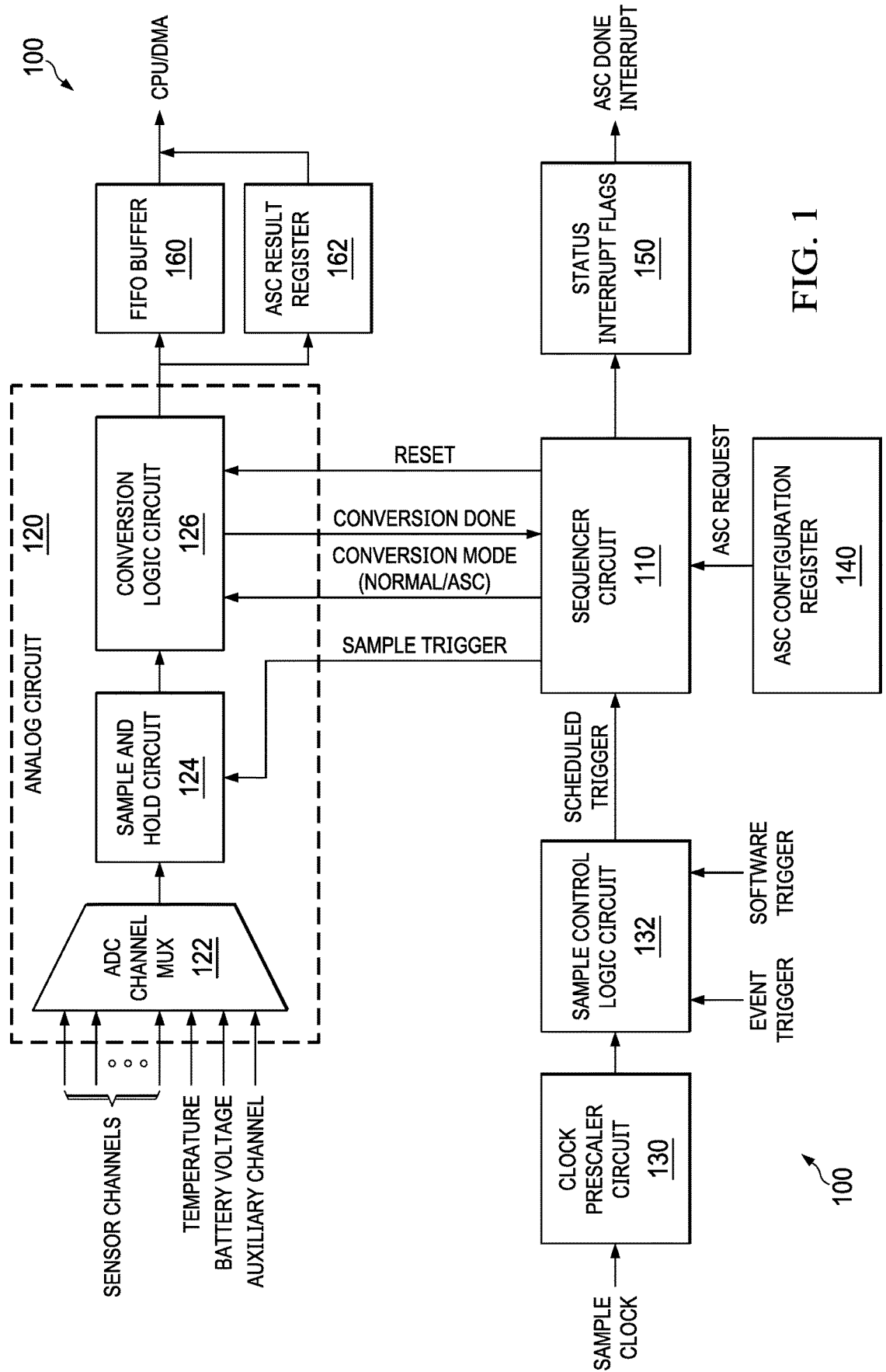
FIG. 1 is a conceptual block diagram of an analog-to-digital converter (ADC) according to some aspects of the present disclosure.

Examples of scheduling ADC operations are described with reference to the figures below. In that regard, FIG. 1 is a conceptual block diagram of an analog-to-digital converter (ADC) 100 according to some aspects of the present disclosure. ADC 100 includes sequencer circuit 110, analog circuit 120, clock prescaler circuit 130, sample control logic circuit 132, ASC configuration register 140, status and interrupt flags 150, result first-in-first-out (FIFO) buffer 160, and ASC result register 162. ADC 100 may be any type of ADC such as a sigma-delta ADC, a successive approximation register ADC, or any other type of ADC. The techniques of this disclosure can be used for any type of ADC.

Analog circuit 120 includes multiplexer 122, sample and hold circuit 124, and conversion logic circuit 126. Multiplexer 122 includes multiple data inputs, where each data input is coupled to a channel. Multiplexer 122 includes an output coupled to an input of sample and hold circuit 124. Multiplexer 122 also includes a select input that may be coupled to sequencer circuit 110. The circuit that is coupled to the select input of multiplexer 122 may be configured to control multiplexer 122 based on value(s) stored in ASC configuration register 140 and/or based on values stored in a user-configurable register for scheduled conversions.

Multiplexer 122 is configured to receive analog signals from multiple inputs, including internal channels and external channels. The external channels may include application-specific external sensor connections. An analog signal originating from an external sensor channel may be a signal from a camera, a radar sensor, an ultrasound sensor, a piezoelectric sensor, and/or any other type of sensor. ADC 100 may be part of a larger device, such as a microcontroller or a system on chip, that has pins or other input nodes that can be coupled to one or more external sensors. The pins may be internally coupled to the data inputs of multiplexer 122. In examples in which the device is mounted on a circuit board, the pins may be coupled to the external sensors through traces on the circuit board.

The internal channels that are coupled to the data inputs of multiplexer 122 may include silicon junction temperature, battery voltage, supply voltage (e.g., a supply rail), reference voltage, another voltage, or any auxiliary channel. In examples in which ADC 100 is part of a larger device, each internal channel may be internally wired to an on-chip circuit or component, such as the supply grid or a temperature sensor module. In some examples, analog circuit 120 is configured to perform an analog-to-digital conversion on only one channel at a time. Nothing in this disclosure should be taken as a disclaimer that only external channels correspond to scheduled conversions and that only internal channels correspond to ASC operations. Although this is possible, some external channels can be used for ASC operations. Additionally or alternatively, some internal channels can be used for scheduled conversions. In some examples, ADC 100 can configure each channel, based on user input, for scheduled conversions and/or for ASC operations.

Multiplexer 122 may be configured to route one of the analog inputs to sample and hold circuit 124, which feeds into conversion logic circuit 126. Sample and hold circuit 124 includes an input coupled to the output of multiplexer 122. Sample and hold circuit 124 also includes an output coupled to an input of conversion logic circuit 126. Sample and hold circuit 124 also includes a sample-trigger line coupled to sequencer circuit 110. Sample and hold circuit 124 is configured to sample an analog signal when sequencer circuit 110 asserts a signal on the sample-trigger line, and sample and hold circuit 124 is configured to release the sampled signal when sequencer circuit 110 deasserts the signal on the sample-trigger line. Sample and hold circuit 124 is configured to temporarily store an analog signal for conversion by conversion logic circuit 126.

Conversion logic circuit 126 may be configured to convert an analog signal that has been sampled by sample and hold circuit 124 into a corresponding digital value. Conversion logic circuit 126 includes an input coupled to the output of sample and hold circuit 124. Conversion logic circuit 126 includes an output coupled to the FIFO buffer 160 and/or ASC result register 162. Conversion logic circuit 126 includes a conversion-mode line, a conversion-done line, and a reset line coupled to sequencer circuit 110. Conversion logic circuit 126 may be configured to store the conversion result in FIFO buffer 160 in response to determining that a signal on the conversion-mode line indicates a scheduled conversion. Conversion logic circuit 126 may be configured to store the conversion result in ASC result register 162 in response to determining that the signal on the conversion-mode line indicates an ASC operation. In response to completing a conversion operation, conversion logic circuit 126 may be configured to send a signal on the conversion-done line to sequencer circuit 110. Conversion logic circuit 126 may be configured to halt a conversion operation and discard any partial result when sequencer circuit 110 asserts a signal on the reset line.

Analog circuit 120 can store the results of scheduled conversions performed by conversion logic circuit 126 in FIFO buffer 160. Processing circuitry such as a central processing unit (CPU), a bus master circuit such, a direct memory access (DMA) controller, or another circuit can then read the conversion results out of FIFO buffer 160. Furthermore, analog circuit 120 can store the results of an ASC operation in ASC result register 162, which may be separate from FIFO buffer 160. ASC result register 162 may include a memory mapped register, which may be more convenient for the entity that requested the ASC operation, as compared to reading the ASC result from FIFO buffer 160. FIFO buffer 160 may be designed for high-throughput operation with DMA, which is less convenient for the requesting entity to retrieve a single result. The requesting entity can interpret the result directly from ASC result register 162, or for multiple ASC results, the requesting entity can move the result directly from ASC result register 162 to random access memory (RAM) for post-processing at a later time.

On the clocking side of ADC 100, clock prescaler circuit 130 receives the sample clock or source clock. Clock prescaler circuit 130 includes an input that may be coupled to a sample clock. Clock prescaler circuit 130 includes an output that may be coupled to sample control logic circuit 132. Clock prescaler circuit 130 may include a divider circuit configured to generate a clocking signal for sample control logic circuit 132. Sample control logic circuit 132 receives either a software-initiated sample trigger signal and/or an event trigger signal from, for example, a peripheral such as a timer. Sample control logic circuit 132 sends the software trigger signal or the event trigger signal to sequencer circuit 110 as a scheduled trigger.

Sequencer circuit 110 may be configured to handle triggers and requests and issue a sample trigger to sample and hold circuit 124. The sample trigger signal sent by sequencer circuit 110 to sample and hold circuit 124 may indicate the sample window or the sample period. Sequencer circuit 110 may receive a request to perform an ASC operation from ASC configuration register 140. The ASC request may be a one-off request or an unscheduled request for an analog-todigital conversion of a signal originating from an internal channel or an auxiliary channel. In response to receiving the ASC request, sequencer circuit 110 can determine the status of analog circuit 120 (e.g., the status of sample and hold circuit 124 and/or conversion logic circuit 126). In some examples, sequencer circuit 110 determine the status of analog circuit 120 based on a signal sent on the conversion-done line by conversion logic circuit 126 to sequencer circuit 110.

In response to determining that analog circuit 120 is busy performing a conversion, sequencer circuit 110 may be configured to keep the ASC request pending until analog circuit 120 becomes idle. In response to determining that analog circuit 120 is not busy, sequencer circuit 110 can start the ASC operation by sending a sample trigger signal to sample and hold circuit 124. Sequencer circuit 110 may be configured to also control multiplexer 122 to select the channel indicated in ASC configuration register 140.

Sequencer circuit 110 can communicate with conversion logic circuit 126 on the conversion-mode line to indicate whether a conversion is a scheduled conversion or an ASC operation. Analog circuit 120 can store the results of scheduled conversions in FIFO buffer 160 and store the results of ASC operations in ASC result register 162. Sequencer circuit 110 may be configured to send a conversion-mode signal to conversion logic circuit 126 indicating whether the conversion is scheduled or ASC. In response to receiving a conversion-mode signal indicating that the conversion is scheduled, conversion logic circuit 126 can store the result in FIFO buffer 160. In response to receiving a conversion-mode signal indicating that the conversion is an ASC operation, conversion logic circuit 126 can store the result in ASC result register 162.

ASC configuration register 140 may contain one or more of the following fields for an ASC operation: (i) the channel, (ii) the voltage reference configuration or source, and (iii) the sample period. When processing circuitry writes to ASC configuration register 140, ASC configuration register 140 generates an ASC request to sequencer circuit 110. The ASC request may be a flag in ASC configuration register 140 that indicates whether an ASC request is pending. The requesting entity can write into ASC configuration register 140 at any time in an ad hoc manner. Sequencer circuit 110 may be configured to control multiplexer 122 to select the ADC channel indicated by a field in ASC configuration register 140.

In some examples, ASC configuration register 140 may be capable of storing a single ASC request, along with the fields associated with that request. In examples in which ASC configuration register 140 is limited to storing a single ASC request, ASC configuration register 140 will not absorb or store any additional ASC requests attempted while there is a pending ASC request. Thus, ASC configuration register 140 may ignore ASC requests while there is a pending ASC request. Alternatively, ASC configuration register 140 may be capable of storing multiple ASC requests at a time. In such examples, ASC configuration register 140 may be include a queue and/or a pipeline for storing the fields associated with each ASC request. Sequencer circuit 110 may be configured to cause analog circuit 120 to perform the requested ASC operations in the order that ASC configuration register 140 receives the ASC requests.

Status and interrupt flags 150 may include an ASC active flag and an ASC done flag. Sequencer circuit 110 can set the ASC active flag in response to receiving an ASC request from ASC configuration register 140. The ASC active flag indicates that an ASC operation has been requested by an entity (e.g., a CPU) writing to ASC configuration register 140. Sequencer circuit 110 can clear the ASC active flag in response to receiving an indication on the conversion-done line that analog circuit 120 has completed the ASC operation. Status and interrupt flags 150 may be implemented as a status register including a first field for the ASC active flag and a second field for the ASC done flag.

Sequencer circuit 110 may be configured to set the ASC done flag in response to receiving an indication from conversion logic circuit 126 on the conversion-done line that the ASC operation is complete. The entity that requested the ASC operation can read the ASC result register 162 in response to determining that the ASC done flag is set. In some examples, the ASC done flag may function as an interrupt to a CPU, such that the setting of the ASC done flag may trigger the CPU to execute an interrupt service routine. After the requesting entity has read the result from ASC result register 162, the requesting entity and/or sequencer circuit 110 can clear the ASC done flag.

Figure 2:
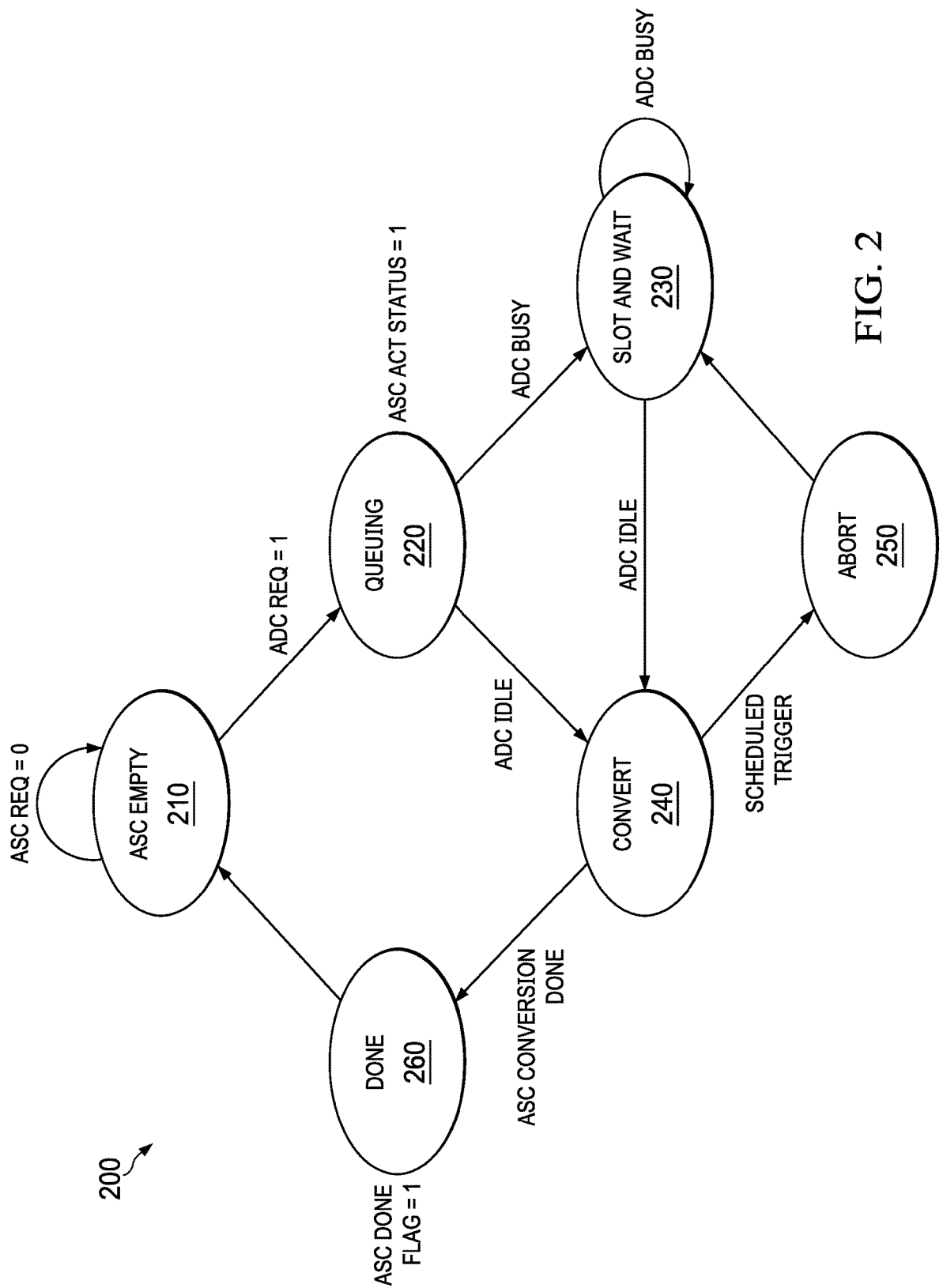
FIG. 2 is a state diagram for a sequencer in an ADC according to some aspects of the present disclosure.

A sequencer circuit of this disclosure may be configured to handle ASC requests based on whether the ADC is idle or busy with other operations. In that regard, FIG. 2 is a state diagram 200 for a sequencer in an ADC according to some aspects of the present disclosure. State diagram 200 includes the following states for the sequencer: ASC empty state 210, queuing state 220, slot-and-wait state 230, convert state 240, abort state 250, and done state 260.

When in ASC empty state 210, the sequencer will remain in ASC empty state 210 if the sequencer has not received an ASC request (e.g., ASC REQ equals zero) because that means a requesting entity has not written to the ASC configuration register. In ASC empty state 210, the ADC may be performing non-ASC operations, such as scheduled conversions and/or conversions on external channels. Thus, ASC empty state 210 refers to whether an ASC request is pending or an ASC operation is occurring, and ASC empty state 210 does not imply that the ADC is idle.

In response to receiving an ASC request, the sequencer may be configured to transition from ASC empty state 210 to queuing state 220. In the transition from ASC empty state 210 to queuing state 220, the sequencer can set the active flag to one. The active flag may be implied by the ASC configuration register including an ASC request, the active flag may be a bit in the ASC configuration register, and/or the active flag may be a field in a status register that is separate from the ASC configuration register.

At queuing state 220, the sequencer determines whether the ADC is performing a conversion operation, either in the sampling phase or the conversion phase. The sequencer can check whether the ADC is busy by reading a conversion-done signal received by the sequencer from an analog circuit in the ADC. In response to determining that the ADC is busy with a conversion operation, the sequencer transitions from queuing state 220 to slot-and-wait state 230. In slot-and-wait state 230, the sequencer continues to check whether the ADC is busy with a conversion operation. As long as the sequencer determines that the ADC is performing a conversion operation, the sequencer may be configured to remain in slot-and-wait state 230.

In response to determining that the ADC is not performing a conversion operation, the sequencer transitions from queuing state 220 or from slot-and-wait state 230 to convert state 240. In convert state 240, the sequencer will cause the ADC to begin performing the ASC operation by, for example, sending a sample trigger to a sample and hold circuit. In convert state 240, the sequencer will maintain the ASC active flag in a set position.

While in convert state 240, if the sequencer receives a scheduled trigger from a control circuit, the sequencer may be configured to transition to abort state 250. The sequencer may receive the scheduled trigger from a CPU or receive an event trigger from an on-chip peripheral like a timer via control logic. The CPU trigger may represent a request by the CPU to perform a scheduled conversion. The event trigger may represent a request by the peripheral to perform a scheduled conversion. In transitioning to abort state 250, the sequencer can send a reset signal to the conversion logic of the ADC, clearing the ASC operation. In transitioning to abort state 250, the sequencer can also send a sample trigger signal to the sample and hold circuit, causing the sample and hold circuit to begin performing the scheduled conversion operation. After aborting the ASC operation and starting the scheduled conversion operation, the sequencer may transition from abort state 250 to slot-and-wait state 230. When the ADC subsequently becomes idle, the sequencer can cause the ADC to restart the ASC operation by transitioning back to convert state 240.

While in convert state 240, the sequencer can check the status of the ASC operation by reading the conversion-done signal received by the sequencer from the conversion logic. In response to determining that the ASC operation is complete, the sequencer can transition from convert state 240 to done state 260. In transitioning from convert state 240 to done state 260, the sequencer may be configured to clear the ASC active flag and set the ASC done flag. The sequencer may then transition from done state 260 to ASC empty state 210 and wait for another request for an ASC operation.

The manner in which the sequencer causes the ADC to perform an ASC operation is based on the conversion mode for scheduling conversions on external or internal channels. A sequencer of this disclosure may be configured to control ADC operations of analog signals received from both external and internal channels. In other words, the sequencer can cause the ADC to perform the scheduled conversions on external or internal channels while scheduling the ASC operations for internal or external channels whenever the sequencer receives an ASC request. A first operation mode for scheduling conversions is single-channel single-conversion operation, where the sequencer selects only one channel and causes the ADC to perform only one conversion.

Figure 3:
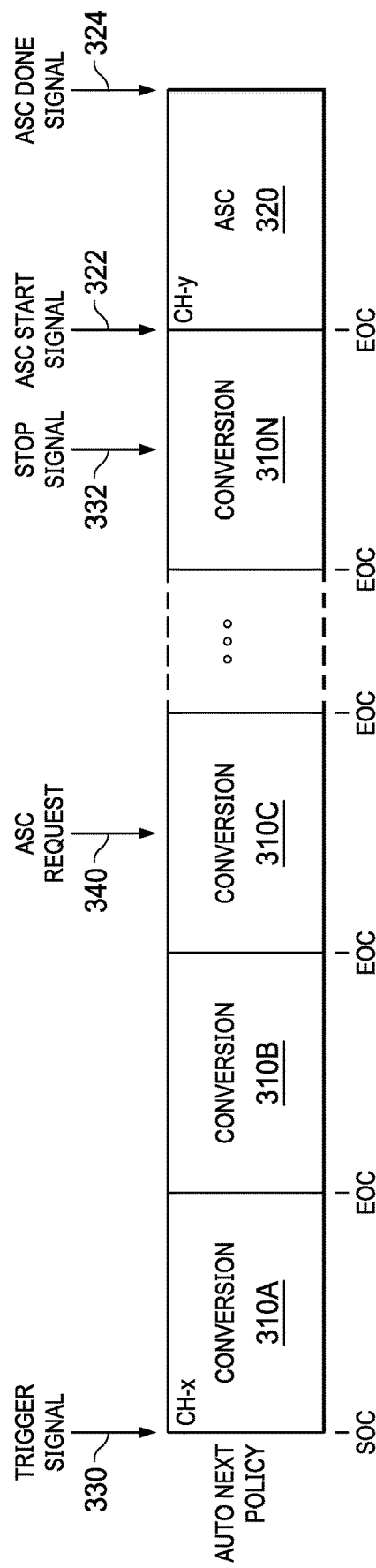
FIG. 3 is a timing diagram of repeat single-channel operation and an auto-next policy according to some aspects of the present disclosure.
Figure 4:
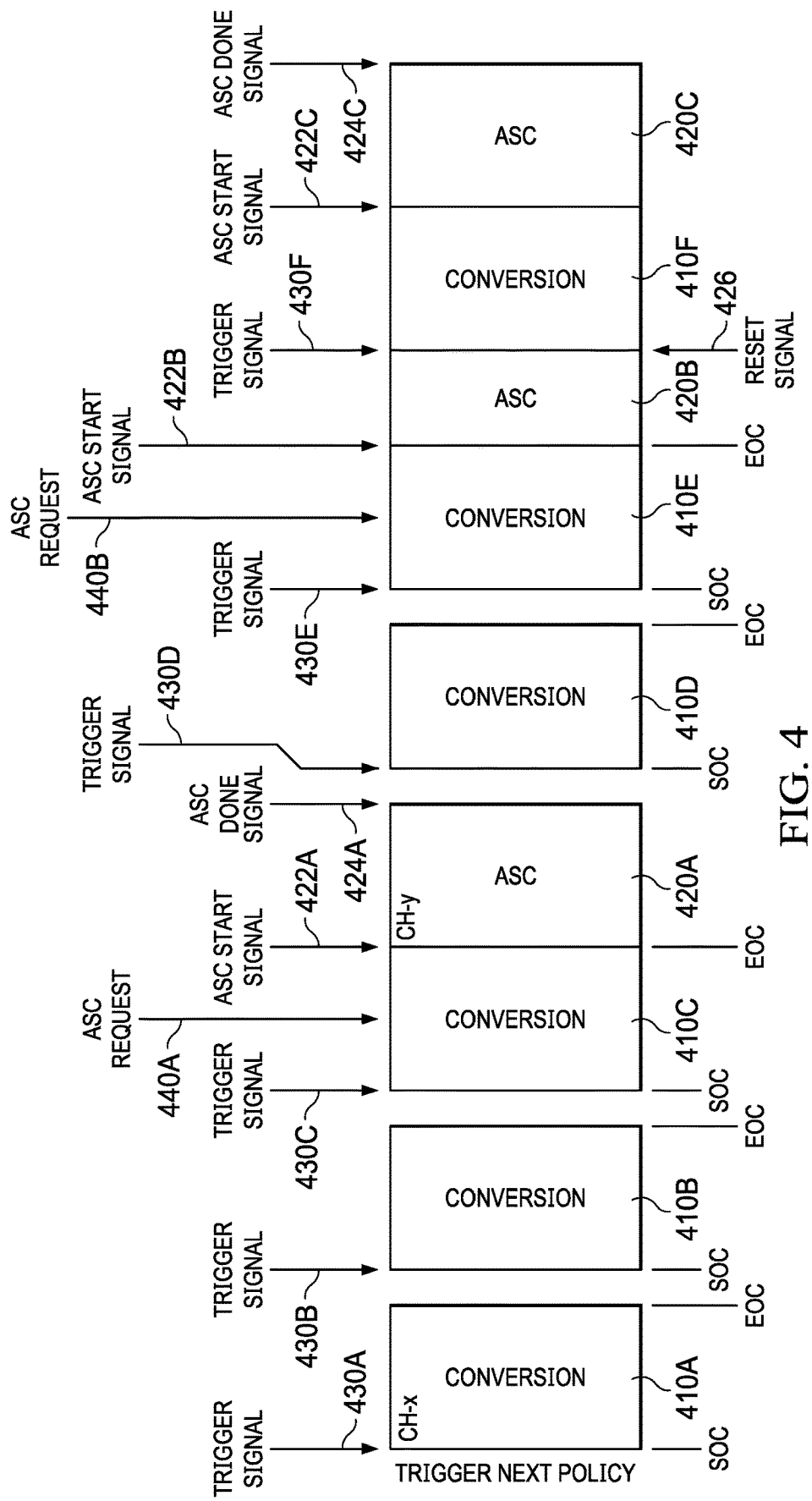
FIG. 4 is a timing diagram of repeat single-channel operation and a trigger-next policy according to some aspects of the present disclosure.

A second operation mode is referred to as repeat single-channel operation, where the sequencer selects one channel and causes the ADC to repeatedly perform multiple conversions, either back-to-back or with a delay after one or more of the conversions. FIG. 3 shows an example of repeat single-channel operation without any delay between repeat conversions using an auto-next policy, and FIG. 4 shows an example of repeat single-channel operation with delays after each conversion using a trigger-next policy. Using an auto-next policy, the sequencer will automatically proceed to the next conversion. Using a trigger-next policy, the sequencer will wait for a sample trigger to begin the next conversion.

Figure 5:
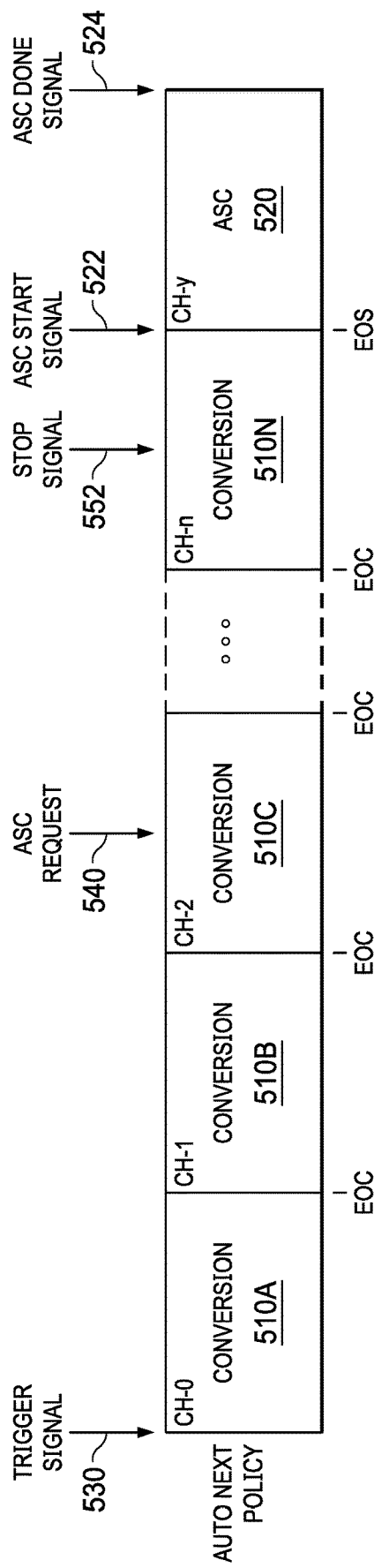
FIG. 5 is a timing diagram of sequence-of-channels operation and an auto-next policy according to some aspects of the present disclosure.
Figure 6:
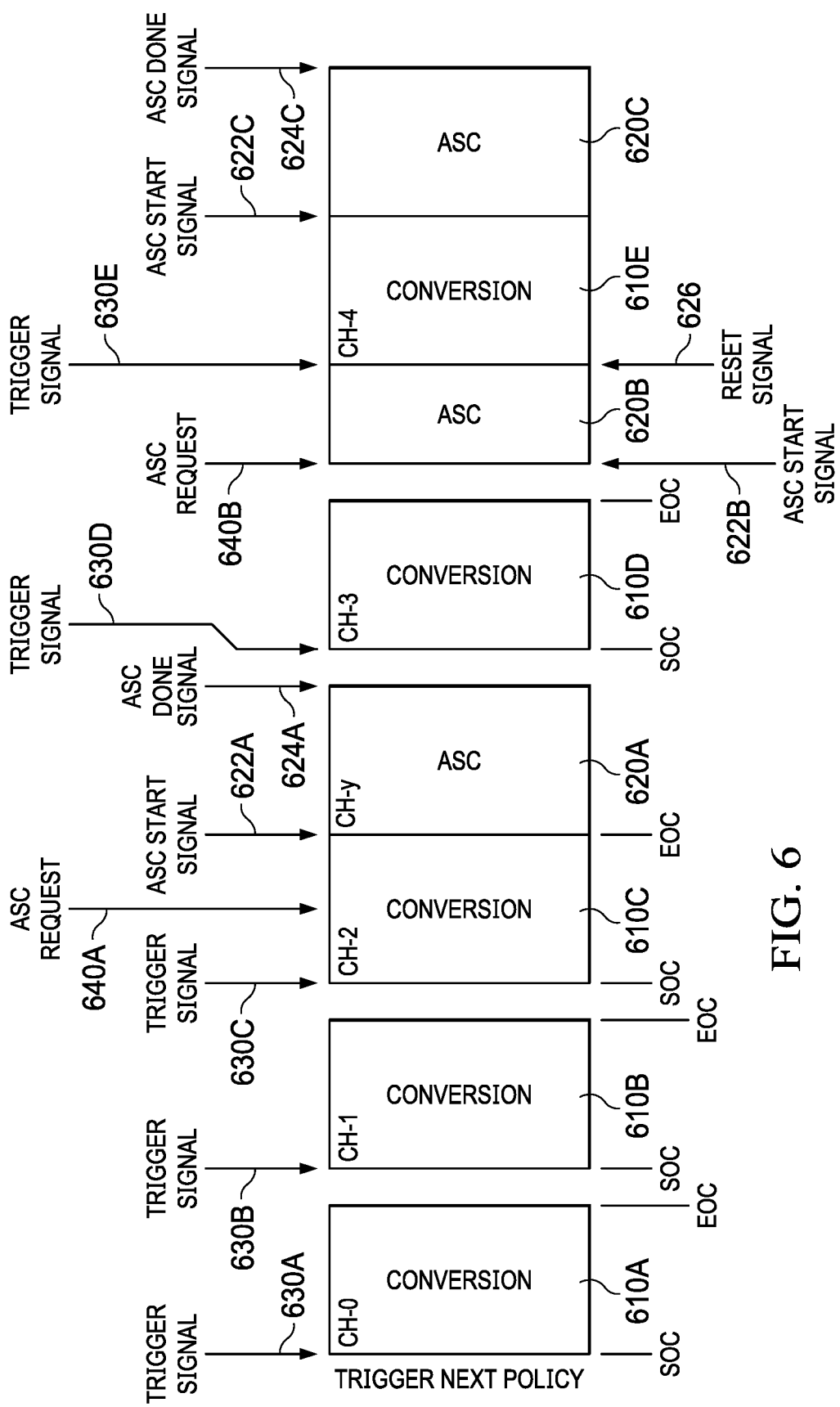
FIG. 6 is a timing diagram of sequence-of-channels operation and a trigger-next policy according to some aspects of the present disclosure.

A third operation mode is referred to as sequence-of-channels operation or scan mode, where the sequencer causes one conversion on each of a plurality of channels. The sequencer can cause the ADC to perform a conversion of a first analog signal originating from a first channel, followed by a conversion of a second analog signal originating from a second channel, and so on. FIGS. 5 and 6 show examples of sequence-of-channels operation using an auto-next policy and a trigger-next policy, respectively. A fourth operation mode is referred to as repeat-sequence operation, where the sequencer will cause the ADC to repeatedly perform a sequence-of-channels operations. How the sequencer handles an ASC request will depend on the operation mode in effect when the sequencer receives an ASC request.

Each of the timing diagrams in FIGS. 3-6 show how a sequencer can superimpose or resolve an ASC request. FIGS. 3 and 4 show conversions on a single channel labeled X, where the channel in the ASC request is labeled Y. In that regard, FIG. 3 is a timing diagram of repeat single-channel operation and an auto-next policy according to some aspects of the present disclosure. In the example shown in FIG. 3, the sequencer causes an ADC to perform conversions 310A-310N back-to-back with little or no delay between each conversion. Responsive to receiving trigger signal 330, the sequencer may be configured to cause the ADC to begin conversion 310A. The sequencer may receive trigger signal 330 from a CPU or a peripheral, and trigger signal 330 indicates that the CPU or peripheral has requested a scheduled conversion. When conversion 310A is complete, the sequencer causes the ADC to perform conversion 310B. When implementing the auto-next policy, the sequencer may be configured to automatically cause the ADC to start the next conversion even if the sequencer does not receive an explicit trigger for the next conversion. In FIGS. 3-6, SOC is an abbreviation for start of conversion, and EOC is an abbreviation for end of conversion.

During conversion 310C, the sequencer receives ASC request 340 from an ASC configuration register. The ASC configuration register may be writable (e.g., able to receive an ASC request) regardless of whether the ADC is performing a conversion on channel X. In the illustrated example, the sequencer cannot find an idle slot in conversions 310A-310N until the repeat single-channel sequence ends after conversion 310N. Until the end of conversion 310N, the sequencer keeps the ASC request pending by not clearing the ASC configuration register and by not clearing the ASC active flag. Thus, in the example shown in FIG. 3, the scheduled conversions on channel X take priority over an ASC operation. The sequencer is unable to resolve ASC request 340 without impacting the timing requirements of conversions 310A-310N.

After receiving ASC request 340, the sequencer continues to cause the ADC to perform conversions 310C-310N until the sequencer receives stop signal 332 during conversion 310N. The sequencer may receive stop signal 332 from, for example, a CPU, and stop signal 332 may indicate that the CPU has determined that conversions 310A-310N are complete or should cease. Responsive to receiving stop signal 332, the sequencer does not cause the ADC to perform another scheduled conversion after conversion 310N is complete. Instead, the sequencer causes the ADC to perform ASC operation 320 after conversion 310N by sending ASC start signal 322 to the sample and hold circuit and/or to the conversion logic of the ADC. ASC start signal 322 may correspond to the sample trigger signal and/or the conversion mode signal shown in FIG. 1.

When ASC operation 320 is complete, the conversion logic may send ASC done signal 324 to the sequencer. Responsive to receiving ASC done signal 324 from the conversion logic, the sequencer can set the ASC done flag, causing the entity that requested the ASC operation to read the ASC result register. Responsive to receiving ASC done signal 324 from the conversion logic, the sequencer can also clear the ASC active flag. The ADC is able to finish ASC operation 320 before the sequencer receives the next trigger signal, which is not shown in FIG. 3.

FIG. 4 is a timing diagram of repeat single-channel operation and a trigger-next policy according to some aspects of the present disclosure. In the example shown in FIG. 4, the sequencer causes an ADC to perform conversions 410A-410F back-to-back with some delay between each conversion. Responsive to receiving each of trigger signals 430A-430F, the sequencer may be configured to cause the ADC to begin a conversion operation. When conversion 410A is complete, the sequencer waits for trigger signal 430B. Responsive to receiving trigger signal 430B, the sequencer causes the ADC to perform conversion 410B. When implementing the trigger-next policy, the sequencer may be configured to refrain from automatically causing the ADC to start the next conversion until the sequencer has received an explicit trigger.

While the ADC is performing conversion 410C, the sequencer receives ASC request 440A from an ASC configuration register. The sequencer waits until conversion 410C is complete to send ASC start signal 422A to cause the ADC to begin ASC operation 420A. The sequencer may be configured to determine that conversion 410C is complete in response to the sequencer receiving a conversion-done signal from the conversion logic of the ADC. In the example shown in FIG. 4, the ADC finishes ASC operation 420A because there is sufficient time after finishing conversion 410C and before the sequencer receives trigger signal 430D. When the ADC finishes ASC operation 420A, the conversion logic sends ASC done signal 424A to the sequencer.

While the ADC is performing conversion 410E, the sequencer receives ASC request 440B from an ASC configuration register. The sequencer waits until conversion 410E is complete to send ASC start signal 422B to cause the ADC to begin ASC operation 420B. The sequencer receives trigger signal 430F before ASC operation 420B is complete. In the example shown in FIG. 4, trigger signal 430F takes priority over ASC operation 420B. Responsive to receiving trigger signal 430F, the sequencer may be configured to abort ASC operation 420B.

In examples in which trigger signal 430F arrives during a sample phase of ASC operation 420B, the sequencer can deassert the sample trigger signal to the sample and hold circuit, and the sequencer can issue reset signal 426 to the conversion logic. In examples in which trigger signal 430F arrives during the conversion phase of ASC operation 420B after the sampling phase has finished, then the sequencer can issue a reset to the conversion logic. To begin conversion 410F, the sequencer can assert the sample trigger to the sample and hold circuit. In the case of a twelve-bit ADC, the sample and conversion operation may take fourteen or more clock cycles. When the sequencer aborts ASC operation 420B before the completion of ASC operation 420B, there may be no result for the ADC to store. Instead, the ADC may discard any partial result that exists in the ADC.

During and after aborting ASC operation 420B, the sequencer can maintain the set position of the ASC active flag, which keeps the ASC request pending. The sequencer may be configured to then cause the ADC to begin conversion 410F. The sequencer may be configured to automatically reperform an aborted ASC operation without any additional ASC request. Responsive to determining that conversion 410F is complete, the sequencer can send ASC start signal 422C to cause the ADC to restart ASC operation 420B as ASC operation 420C. The sequencer can determine that the ASC operation requested by ASC request 440B is still pending by reading the ASC active flag and/or by reading the ASC configuration register. In the example shown in FIG. 4, the ADC finishes ASC operation 420C before the sequencer receives the next trigger signal. When the ADC finishes ASC operation 420C, the conversion logic sends ASC done signal 424C to the sequencer.

FIG. 5 is a timing diagram of sequence-of-channels operation and an auto-next policy according to some aspects of the present disclosure. In the example shown in FIG. 5, the sequencer causes an ADC to perform conversions 510A-510N across channels zero through N back-to-back with little or no delay between each conversion using an auto-next policy. The sequencer may be configured to automatically cause the ADC to start the next conversion even if the sequencer does not receive an explicit trigger for the next conversion.

During conversion 510C, the sequencer receives ASC request 540 from an ASC configuration register. In this example, the sequencer cannot find an idle slot in conversions 510A-510N until the sequence of channels conversion ends after conversion 510N. Until the end of conversion 510N, the sequencer keeps the ASC request pending by not clearing the ASC configuration register and by not clearing the ASC active flag. Thus, in the example shown in FIG. 5, the scheduled conversions on channels zero through N take priority over an ASC operation. After receiving ASC request 540, the sequencer continues to cause the ADC to perform conversions 510C-510N until the sequencer finishes the last conversion in the sequence (i.e., conversion 510N).

After conversion 510N is complete, the sequencer causes the ADC to perform ASC operation 520 after conversion 510N by sending ASC start signal 522 to the sample and hold circuit and/or to the conversion logic of the ADC. When ASC operation 520 is complete, the conversion logic may send ASC done signal 524 to the sequencer. Responsive to receiving ASC done signal 524 from the conversion logic, the sequencer can set the ASC done flag to cause the entity that requested the ASC operation to read the ASC result register. The ADC is able to finish ASC operation 520 before the sequencer receives the next trigger signal, which is not shown in FIG. 5.

FIG. 6 is a timing diagram of sequence-of-channels operation and a trigger-next policy according to some aspects of the present disclosure. In the example shown in FIG. 6, the sequencer causes an ADC to perform conversions 610A-610E back-to-back with some delay between each conversion. Responsive to receiving each of trigger signals 630A-630E, the sequencer may be configured to cause the ADC to begin a conversion operation. When conversion 610A is complete, the sequencer waits for trigger signal 630B. Responsive to receiving trigger signal 630B, the sequencer causes the ADC to perform conversion 610B.

During conversion 610C, the sequencer receives ASC request 640A from an ASC configuration register. The sequencer waits until conversion 610C is complete to send ASC start signal 622A to cause the ADC to begin ASC operation 620A. In the example shown in FIG. 6, the ADC finishes ASC operation 620A because there is sufficient time after finishing conversion 610C and before the sequencer receives trigger signal 630D. When the ADC finishes ASC operation 620, the conversion logic sends ASC done signal 624A to the sequencer.

After completing conversion 610D, the sequencer receives ASC request 640B from an ASC configuration register. Responsive to receiving ASC request 640B, the sequencer sends ASC start signal 622B to cause the ADC to begin ASC operation 620B. The sequencer receives trigger signal 630E before ASC operation 620B is complete. In the example shown in FIG. 6, trigger signal 630E takes priority over ASC operation 620B. Responsive to receiving trigger signal 630E, the sequencer may be configured to abort ASC operation 620B by, for example, sending reset signal 626.

During and after aborting ASC operation 620B, the sequencer can maintain the set position of the ASC active flag, which keeps the ASC request pending. The sequencer may be configured to then cause the ADC to begin conversion 610E. Responsive to determining that conversion 610E is complete, the sequencer can send ASC start signal 622C to cause the ADC to restart ASC operation 620B as ASC operation 620C. The sequencer can determine that the ASC operation requested by ASC request 640B is still pending by reading the ASC active flag and/or by reading the ASC configuration register. In the example shown in FIG. 6, the ADC finishes ASC operation 620C before the sequencer receives the next trigger signal. When the ADC finishes ASC operation 620C, the conversion logic sends ASC done signal 624C to the sequencer.

Figure 7:
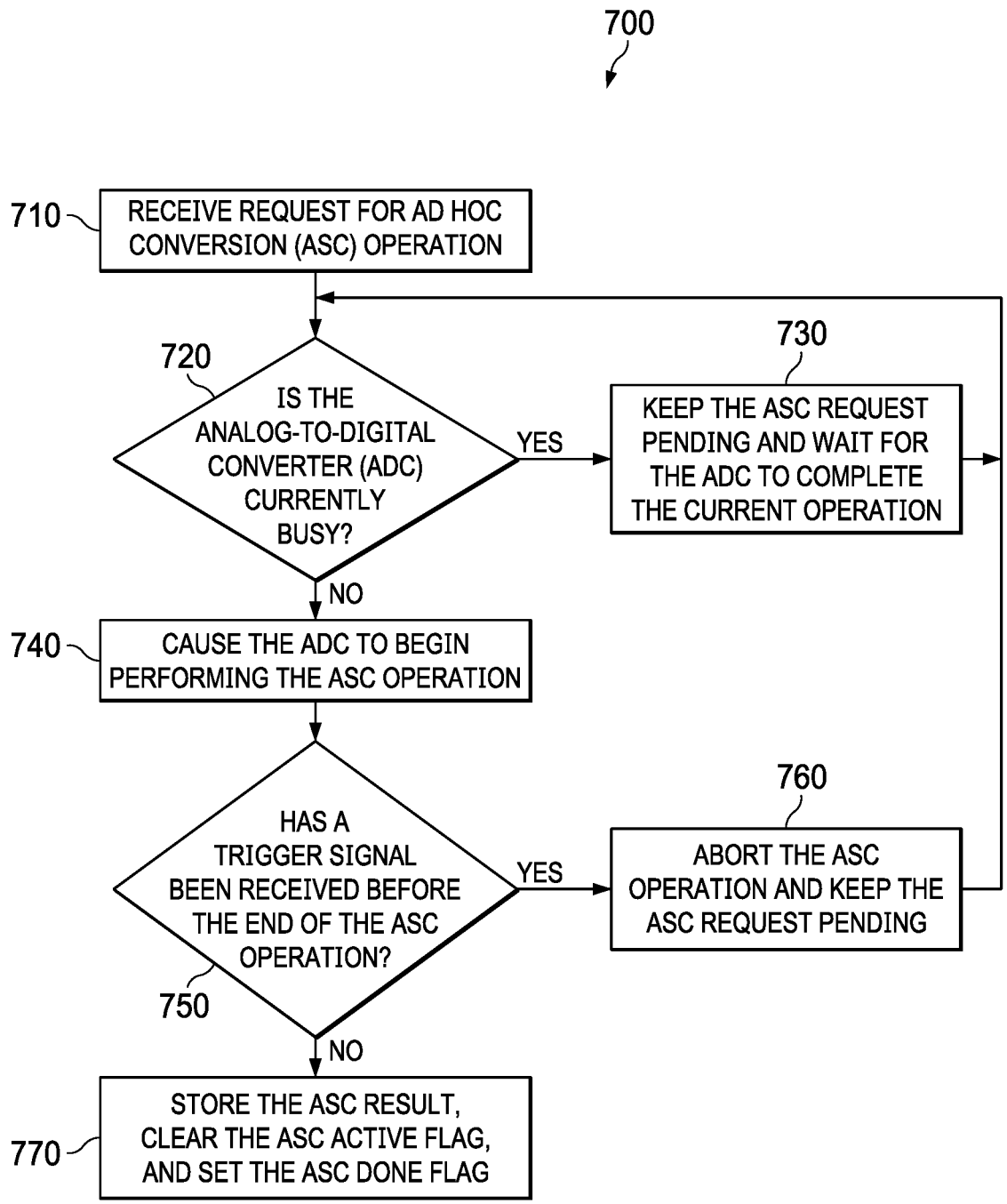
FIG. 7 is a flow diagram of a method of scheduling analog-to-digital conversions according to some aspects of the present disclosure.

FIG. 7 is a flow diagram of a method of scheduling analog-to-digital conversions according to some aspects of the present disclosure. Some processes of the method 700 may be performed in orders other than described, and many processes may be performed concurrently in parallel. Furthermore, processes of the method 700 may be omitted or substituted in some examples of the present disclosure. The method 700 is described with reference to sequencer circuit 110 shown in FIG. 1, although other entities or components may exemplify similar techniques.

Referring to block 710, sequencer circuit 110 receives a request for an ASC operation from ASC configuration register 140. Sequencer circuit 110 can receive the ASC request by reading ASC configuration register 140 to determine whether an entity such as a CPU has written an ASC request into ASC configuration register 140. Sequencer circuit 110 may treat any write to ASC configuration register 140 as an ASC request. After receiving the ASC request, sequencer circuit 110 may be configured to set the ASC active flag, which indicates a pending request for ASC operation.

Referring to block 720, sequencer circuit 110 determines whether analog circuit 120 is currently busy. Sequencer circuit 110 can determine whether analog circuit 120 is busy by determining the status of sample and hold circuit 124 or the status of conversion logic circuit 126. Another possible technique for determining whether analog circuit 120 is busy is for sequencer circuit 110 to monitor the conversion-done line.

Referring to block 730, responsive to determining that analog circuit 120 is busy, sequencer circuit 110 keeps the ASC request pending and waits for analog circuit 120 to become idle. Sequencer circuit 110 can keep the ASC request pending by maintaining the set position of the ASC active flag and not clearing the contents in ASC configuration register 140. While waiting for analog circuit 120 to complete the current operation, sequencer circuit 110 may be configured to continually return to block 720 to check whether analog circuit 120 is currently busy.

Referring to block 740, responsive to determining that analog circuit 120 is not busy, sequencer circuit 110 causes analog circuit 120 to begin performing the ASC operation. Sequencer circuit 110 can cause analog circuit 120 to begin the ASC operation by asserting a signal on the sample-trigger line to sample and hold circuit 124. Sequencer circuit 110 can also send a signal on the conversion-mode line to conversion logic circuit 126 indicating that this conversion is an ASC operation.

Referring to block 750, sequencer circuit 110 determines whether sequencer circuit 110 has received a trigger signal before the end of the ASC operation. To determine whether a trigger signal has been received, sequencer circuit 110 can monitor the lines coupling sequencer circuit 110 to sample control logic circuit 132 and to ASC configuration register 140.

Referring to block 760, responsive to determining that sequencer circuit 110 received a trigger signal before the end of the ASC operation, sequencer circuit 110 aborts the ASC operation and keeps the ASC request pending. Sample control logic circuit 132 can send a trigger signal to sequencer circuit 110 requesting a scheduled conversion, which may have priority over the ASC operation. Sequencer circuit 110 can abort the ASC operation by deasserting the sample-trigger signal and/or sending a reset signal to conversion logic circuit 126. After aborting the ASC operation, sequencer circuit 110 may be configured to return to block 720 to check whether analog circuit 120 is currently busy. While aborting the ASC operation, sequencer circuit 110 may be configured to maintain the set position of the ASC active flag.

Referring to block 770, responsive to determining that the ASC operation completed before sequencer circuit 110 received a trigger signal, sequencer circuit 110 stores the ASC result to ASC result register 162, clears the ASC active flag, and sets the ASC done flag. Sequencer circuit 110 may also clear the contents of ASC configuration register 140 in response to determining that the ASC operation is complete.

The techniques of this disclosure may allow for a single sequencer circuit to schedule operations for a single ADC to handle both internal and external channels. The sequencer circuit may be able to resolve ASC requests during the gaps between scheduled conversions, thus increasing the throughput, efficiency, and capacity of the ADC. Although these techniques may be useful for single-ADC, single-sequencer devices, nothing in this disclosure should be interpreted as limiting these techniques to single-ADC and/or single-sequencer implementations.

ASC operations for the internal channels may occur less frequently than scheduled conversions (e.g., on the external channels). In addition, the ADC may be part of a larger system where the analog signals for scheduled conversions may be more important than the signals originating from other channels. For example, the ADC may be part of a vehicle system with sensors for detecting obstacles. The ADC may be tasked with converting analog signals generated by the sensors to digital numbers for processing by an obstacle-avoidance system. For at least these reasons, the sequencer circuit may prioritize scheduled conversions over ASC operations. Nonetheless, the ASC operations on the internal channels are important for the functioning of the device. Thus, the techniques of this disclosure allow for an ADC to efficiently schedule both types of conversion operations.

In internet of things edge applications and other sensing applications, the channels of an ADC are connected to one or more external sensors. The ADC can be configured to perform continuous or scheduled periodic conversions on those sensor channels. It may also be desirable for the device to measure silicon junction temperature, battery voltage, or an input from an external auxiliary channel from time to time using the same ADC without affecting the scheduled conversions on the ADC channels that are connected to external sensors.

For example, the ADC channels may be connected to external sensors for measuring pressure, ambient light, or motion. These channels have to be converted with precise timing based on scheduled conversion triggers. But challenges may arise if the ADC is also designed to measure silicon junction temperature or battery voltage through ad-hoc requests without affecting the scheduled ADC conversions on the external sensor channels. The ADC may include a sequencer that can take in ASC requests from software while the ADC is performing scheduled conversions on the sensor channels. The sequencer can slot the ASC requests at a suitable time when the ADC has an idle window in between scheduled conversions without affecting the timing integrity of the scheduled conversions.

The following numbered aspects demonstrate one or more aspects of the disclosure.

Aspect 1. A method includes receiving, at a sequencer circuit of an analog-to-digital converter (ADC), a first request to perform a first conversion. In addition, the method includes determining, by the sequencer circuit, that the ADC is not busy. The method further includes responsive to determining that the ADC is not busy, and by the sequencer circuit, causing the ADC to perform the first conversion. The method also includes receiving, at the sequencer circuit, a second request to perform a second conversion. The method includes determining, by the sequencer circuit, that the ADC is busy and, responsive to determining that the ADC is busy, and by the sequencer circuit, waiting to cause the ADC to perform the second conversion.

Aspect 2. The method of the preceding aspect, where determining whether the ADC is busy includes determining whether the ADC at a first time, the method further including, responsive to determining that the ADC is busy at the first time, determining whether the ADC is busy at a second time after the first time.

Aspect 3. The method of the preceding aspect, further including, responsive to determining that the ADC is not busy at the second time, causing the ADC to perform the second conversion.

Aspect 4. The method of aspect 2 or aspect 3, further including, responsive to determining that the ADC is busy at the second time, continuing to wait to cause the ADC to perform the second conversion.

Aspect 5. The method of the preceding aspects or any combination thereof, where the first conversion is based on a first analog signal originating from a first channel.

Aspect 6. The method of the preceding aspects or any combination thereof, further including, while the ADC is performing the first conversion, receiving a third request to perform a third conversion of a second analog signal originating from a second channel.

Aspect 7. The method of the preceding aspect, where the second channel is different from the first channel.

Aspect 8. The method of the two preceding aspects or any combination thereof, further including causing the ADC to stop the first conversion in response to receiving the third request.

Aspect 9. The method of the three preceding aspects or any combination thereof, further including causing the ADC to perform the third conversion after stopping the first conversion.

Aspect 10. The method of the four preceding aspects or any combination thereof, further including after the ADC has completed the third conversion, causing the ADC to restart the first conversion.

Aspect 11. The method of the preceding aspects or any combination thereof, further including receiving a conversion-done signal from a conversion logic circuit.

Aspect 12. The method of the preceding aspects or any combination thereof, further including determining that the first conversion is not complete based on a conversion-done signal received from a conversion logic circuit.

Aspect 13. The method of the preceding aspects or any combination thereof, further including causing the ADC to stop the first conversion by at least deasserting a sample-trigger signal routed to a sample and hold circuit in response to determining that the first conversion is not complete.

Aspect 14. The method of the preceding aspects or any combination thereof, further including causing the ADC to stop the first conversion by at least sending a reset signal to a conversion logic circuit in response to determining that the first conversion is not complete.

Aspect 15. The method of the preceding aspects or any combination thereof, further including setting a flag in response to receiving the first request.

Aspect 16. The method of the preceding aspect, further including maintaining the flag at a set value while causing the ADC to stop the first conversion.

Aspect 17. The method of the preceding aspects or any combination thereof, where determining that the ADC is busy includes determining that the ADC is performing a sequence of conversions.

Aspect 18. The method of the preceding aspects or any combination thereof, further including waiting to cause the ADC to perform the second conversion until the ADC is finished performing a sequence of conversions.

Aspect 19. The method of the preceding aspects or any combination thereof, where the ADC is part of a device, and the second request is to perform the second conversion of a first analog signal originating from a channel inside the device.

Aspect 20. The method of the preceding aspects or any combination thereof, where the ADC is part of a device, and determining whether the ADC is busy includes determining whether the ADC is currently performing a third conversion of a second analog signal originating from a sensor external to the device.

Aspect 21. The method of the preceding aspects or any combination thereof, where receiving the first request includes reading data stored in a configuration register.

Aspect 22. The method of the preceding aspect, further including determining a voltage reference based on the data stored in the configuration register.

Aspect 23. The method of the two preceding aspects or any combination thereof, further including determining a sample period for the first conversion based on the data stored in the configuration register.

Aspect 24. The method of the preceding aspects or any combination thereof, where determining whether the ADC is busy includes determining whether the ADC is currently performing a third conversion.

Aspect 25. The method of the preceding aspect, further including storing a first result of the third conversion in a first-in-first-out buffer.

Aspect 26. The method of the preceding aspect, further including storing a second result of the first conversion in a register separate from the first-in-first-out buffer.

Aspect 27. A device includes an internal channel and an ADC including an analog circuit coupled to the internal channel and configured to receive a first analog signal via the internal channel. In addition, the ADC includes a sequencer circuit coupled to the analog circuit and configured to perform the method of the preceding aspects or any combination thereof.

Aspect 28. A device includes an internal channel and an ADC including an analog circuit coupled to the internal channel and configured to receive a first analog signal via the internal channel. In addition, the ADC includes a sequencer circuit coupled to the analog circuit and configured to receive a request to perform a first conversion of the first analog signal. The sequencer circuit is also configured to determine whether the analog circuit is busy and, responsive to determining that the analog circuit is not busy, cause the analog circuit to perform the first conversion. The sequencer circuit is further configured to, responsive to determining that the analog circuit is busy, wait to cause the analog circuit to perform the first conversion.

Aspect 29. The device of the preceding aspect, where the sequencer circuit is configured to perform the method of aspects 1-26 or any combination thereof.

Aspect 30. The device of the two preceding aspects, further including a node configured to be coupled to an external sensor.

Aspect 31. The device of the preceding aspect, where the sequencer circuit is configured to, while the analog circuit is performing the first conversion, receive a second request to perform a second conversion of a second analog signal originating from the external sensor.

Aspect 32. The device of the preceding aspect, where the sequencer circuit is configured to cause the analog circuit to stop the first conversion in response to receiving the second request.

Aspect 33. The device of the preceding aspect, where the sequencer circuit is configured to cause the analog circuit to perform the second conversion after stopping the first conversion.

Aspect 34. The device of the preceding aspect, where the sequencer circuit is configured to, after the analog circuit has completed the second conversion, cause the analog circuit to restart the first conversion.

Aspect 35. The device of aspects 27-34 or any combination thereof, further including a sample and hold circuit and a conversion logic circuit.

Aspect 36. The device of the preceding aspect, where the sequencer circuit is configured to receive a conversion-done signal from the conversion logic circuit.

Aspect 37. The device of the preceding aspect, where the sequencer circuit is configured to determine that the first conversion is not complete based on the conversion-done signal.

Aspect 38. The device of the preceding aspect, where the sequencer circuit is configured to cause the analog circuit to stop the first conversion by at least deasserting a sample-trigger signal routed to the sample and hold circuit in response to determining that the first conversion is not complete.

Aspect 39. The device of the two preceding aspects or any combination thereof, where the sequencer circuit is configured to cause the analog circuit to stop the first conversion by at least sending a reset signal to the conversion logic circuit in response to determining that the first conversion is not complete.

Aspect 40. The device of aspects 27-39 or any combination thereof, further including a configuration register.

Aspect 41. The device of the preceding aspect, where to receive the request, the sequencer circuit is configured to read data stored in the configuration register.

Aspect 42. The device of the two preceding aspects or any combination thereof, where the sequencer circuit is configured to determine a voltage reference based on the data stored in the configuration register.

Aspect 43. The device of the three preceding aspects or any combination thereof, where the sequencer circuit is configured to determine a sample period for the first conversion based on the data stored in the configuration register.

Aspect 44. The device of aspects 27-43 or any combination thereof, further including a first-in-first-out buffer and a register separate from the first-in-first-out buffer.

Aspect 45. The device of the preceding aspect, where the sequencer circuit is configured to store a first result of the first conversion in the register.

Aspect 46. The device of the two preceding aspects, where to determine whether the analog circuit is busy, the sequencer circuit is configured to determine whether the analog circuit is currently performing a second conversion.

Aspect 47. The device of the preceding aspect, where the sequencer circuit is configured to store a second result of the second conversion in the first-in-first-out buffer.

Aspect 48. A device includes a node configured to couple to an external sensor. In addition, the device includes an internal channel and an analog-to-digital converter (ADC) including a multiplexer including a first data input coupled to the node. The multiplexer also includes a second data input coupled to the internal channel, and the multiplexer further includes an output. The ADC includes a sample and hold circuit including an input coupled to the output of the multiplexer, where the sample and hold circuit also includes a sample-trigger line and an output. The ADC further includes a conversion logic circuit including an input coupled to the output of the sample and hold circuit. The conversion logic circuit also includes a conversion-mode line, a conversion-done line, a reset line, and an output; a result register coupled to the output. The ADC includes a sequencer circuit coupled to the sample-trigger line, the conversion-mode line, the conversion-done line, the reset line.

Aspect 49. The device of the preceding aspect, where the sequencer circuit is configured to perform the method of aspects 1-26 or any combination thereof.

Aspect 50. The device of the two preceding aspects or any combination thereof, further including a configuration register including a request line.

Aspect 51. The device of the preceding aspect, where the configuration register also includes a first field indicating a conversion channel.

Aspect 52. The device of the two preceding aspects or any combination thereof, where the configuration register also includes a second field indicating a reference voltage source.

Aspect 53. The device of the three preceding aspects or any combination thereof, where the configuration register also includes a third field indicating a sample period.

Aspect 54. A non-transitory computer-readable medium having executable instructions stored thereon, configured to be executable by processing circuitry for causing the processing circuitry to perform the method of aspects 1-26 or any combination thereof.

Aspect 55. A system including means for performing the method of aspects 1-26 or any combination thereof.

This disclosure has attributed functionality to sequencer circuit 110, and conversion logic circuit 126, and sample control logic circuit 132. Sequencer circuit 110, and conversion logic circuit 126, and sample control logic circuit 132 may include one or more processors. Sequencer circuit 110, and conversion logic circuit 126, and sample control logic circuit 132 may include any combination of integrated circuitry, discrete logic circuitry, analog circuitry, such as one or more microprocessors, microcontrollers, DSPs, application specific integrated circuits (ASICs), CPUs, graphics processing units (GPUs), FPGAs, and/or any other processing resources.

In some examples, sequencer circuit 110, and conversion logic circuit 126, and sample control logic circuit 132 may include multiple components, such as any combination of the processing resources listed above, as well as other discrete or integrated logic circuitry, and/or analog circuitry.

The techniques described in this disclosure may also be embodied or encoded in an article of manufacture including a non-transitory computer-readable storage medium. Example non-transitory computer-readable storage media may include RAM, read-only memory (ROM), programmable ROM (PROM), erasable programmable ROM (EPROM), electronically erasable programmable ROM (EEPROM), flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

It is understood that the present disclosure provides a number of exemplary embodiments and that modification are possible to these embodiments. Such modifications are expressly within the scope of this disclosure. Furthermore, application of these teachings to other environments, applications, and/or purposes is consistent with and contemplated by the present disclosure.

What is claimed is:

1. A method comprising:
   receiving, at a sequencer circuit of an analog-to-digital converter (ADC), a first request to perform a first conversion;
   determining, by the sequencer circuit, that the ADC is not busy;
   responsive to determining that the ADC is not busy, and by the sequencer circuit, causing the ADC to perform the first conversion;
   receiving, at the sequencer circuit, a second request to perform a second conversion;
   determining, by the sequencer circuit, that the ADC is busy; and
   responsive to determining that the ADC is busy, and by the sequencer circuit, waiting to cause the ADC to perform the second conversion, wherein the ADC is part of a device, wherein the second request is to perform the second conversion of a first analog signal originating from a channel inside the device, and wherein determining whether the ADC is busy comprises determining whether the ADC is currently performing a third conversion of a second analog signal originating from a sensor external to the device..

2. The method of claim 1, wherein determining whether the ADC is busy comprises determining whether the ADC is busy at a first time, wherein the method further comprises:
   responsive to determining that the ADC is busy at the first time, determining whether the ADC is busy at a second time after the first time;
   responsive to determining that the ADC is not busy at the second time, causing the ADC to perform the second conversion; and
   responsive to determining that the ADC is busy at the second time, continuing to wait to cause the ADC to perform the second conversion.

3. The method of claim 1, wherein receiving the first request comprises reading data stored in a configuration register.

4. The method of claim 3, further comprising:
   determining a voltage reference based on the data stored in the configuration register; and
   determining a sample period for the first conversion based on the data stored in the configuration register.

5. A method comprising:
   receiving, at a sequencer circuit of an analog-to-digital converter (ADC), a first request to perform a first conversion;
   determining, by the sequencer circuit, that the ADC is not busy;
   responsive to determining that the ADC is not busy, and by the sequencer circuit, causing the ADC to perform the first conversion;
   receiving, at the sequencer circuit, a second request to perform a second conversion;
   determining, by the sequencer circuit, that the ADC is busy; and
   responsive to determining that the ADC is busy, and by the sequencer circuit, waiting to cause the ADC to perform the second conversion, wherein the first conversion is based on a first analog signal originating from a first channel, the method further comprising:
   while the ADC is performing the first conversion, receiving a third request to perform a third conversion of a second analog signal originating from a second channel, wherein the second channel is different from the first channel;
   causing the ADC to stop the first conversion in response to receiving the third request;
   causing the ADC to perform the third conversion after stopping the first conversion; and
   after the ADC has completed the third conversion, causing the ADC to restart the first conversion.

6. The method of claim 5, further comprising:
   receiving a conversion-done signal from a conversion logic circuit; and
   determining that the first conversion is not complete based on the conversion-done signal,
   wherein causing the ADC to stop the first conversion comprises:
      deasserting a sample-trigger signal routed to a sample and hold circuit in response to determining that the first conversion is not complete; and
      sending a reset signal to the conversion logic circuit in response to determining that the first conversion is not complete.

7. The method of claim 5, further comprising:
setting a flag in response to receiving the first request; and
maintaining the flag at a set value while causing the ADC to stop the first conversion.

8. A method comprising:
   receiving, at a sequencer circuit of an analog-to-digital converter (ADC), a first request to perform a first conversion;

determining, by the sequencer circuit, that the ADC is not busy;
responsive to determining that the ADC is not busy, and by the sequencer circuit, causing the ADC to perform the first conversion;
receiving, at the sequencer circuit, a second request to perform a second conversion;
determining, by the sequencer circuit, that the ADC is busy; and
responsive to determining that the ADC is busy, and by the sequencer circuit, waiting to cause the ADC to perform the second conversion, wherein determining that the ADC is busy comprises determining that the ADC is performing a sequence of conversions, and wherein the method further comprises waiting to cause the ADC to perform the second conversion until the ADC is finished performing the sequence of conversions.

9. A method comprising:
receiving, at a sequencer circuit of an analog-to-digital converter (ADC), a first request to perform a first conversion;
determining, by the sequencer circuit, that the ADC is not busy;
responsive to determining that the ADC is not busy, and by the sequencer circuit, causing the ADC to perform the first conversion;
receiving, at the sequencer circuit, a second request to perform a second conversion;
determining, by the sequencer circuit, that the ADC is busy; and
responsive to determining that the ADC is busy, and by the sequencer circuit, waiting to cause the ADC to perform the second conversion, wherein determining whether the ADC is busy comprises determining whether the ADC is currently performing a third conversion, the method further comprising:
storing a first result of the third conversion in a first-in-first-out buffer; and
storing a second result of the first conversion in a register separate from the first-in-first-out buffer.

10. The method of claim 9, wherein receiving the first request comprises reading data stored in a configuration register, the method further comprising determining a sample period for the first conversion based on the data stored in the configuration register.

11. A device comprising:
an internal channel; and
an analog-to-digital converter (ADC) including:
  an analog circuit coupled to the internal channel and configured to receive a first analog signal via the internal channel; and
  a sequencer circuit coupled to the analog circuit and configured to:
    receive a request to perform a first conversion of the first analog signal;
    determine whether the analog circuit is busy;
    responsive to determining that the analog circuit is not busy, cause the analog circuit to perform the first conversion; and
    responsive to determining that the analog circuit is busy, wait to cause the analog circuit to perform the first conversion.

12. The device of claim 11, wherein to determine whether the analog circuit is busy, the sequencer circuit is configured to determine whether the analog circuit is busy at a first time, and wherein the sequencer circuit is further configured to:
responsive to determining that the analog circuit is busy at the first time, determine whether the analog circuit is busy at a second time after the first time;
responsive to determining that the analog circuit is not busy at the second time, cause the analog circuit to perform the first conversion; and
responsive to determining that the analog circuit is busy at the second time, continue to wait to cause the analog circuit to perform the first conversion.

13. The device of claim 11, wherein the request is a first request to perform the first conversion of the first analog signal, wherein the device further comprises a node configured to be coupled to an external sensor; and
wherein the sequencer circuit is further configured to:
  while the analog circuit is performing the first conversion, receive a second request to perform a second conversion of a second analog signal originating from the external sensor;
  cause the analog circuit to stop the first conversion in response to receiving the second request;
  cause the analog circuit to perform the second conversion after stopping the first conversion; and
  after the analog circuit has completed the second conversion, cause the analog circuit to restart the first conversion.

14. The device of claim 13, wherein the analog circuit comprises a sample and hold circuit and a conversion logic circuit, wherein the sequencer circuit is further configured to:
receive a conversion-done signal from the conversion logic circuit; and
determine that the first conversion is not complete based on the conversion-done signal, and
wherein to cause the analog circuit to stop the first conversion, the sequencer circuit is configured to:
  deassert a sample-trigger signal routed to the sample and hold circuit in response to determining that the first conversion is not complete; and
  send a reset signal to the conversion logic circuit in response to determining that the first conversion is not complete.

15. The device of claim 11, wherein the sequencer circuit is further configured to:
set a flag in response to receiving the request; and
maintain the flag at a set value while causing the analog circuit to stop the first conversion.

16. The device of claim 11, wherein the ADC further includes a configuration register, and wherein to receive the request, the sequencer circuit is configured to read data stored in the configuration register.

17. The device of claim 16, wherein the sequencer circuit is further configured to:
determine a voltage reference based on the data stored in the configuration register; and
determine a sample period for the first conversion based on the data stored in the configuration register.

18. The device of claim 11, wherein the ADC further includes a first-in-first-out buffer and a register separate from the first-in-first-out buffer, wherein to determine whether the analog circuit is busy, the sequencer circuit is configured to determine whether the analog circuit is currently performing a second conversion, and wherein the sequencer circuit is further configured to:
store a first result of the first conversion in the register; and
store a second result of the second conversion in the first-in-first-out buffer.

19. A device comprising:
a node configured to couple to an external sensor;
an internal channel; and
an analog-to-digital converter (ADC) including:
- a multiplexer including a first data input coupled to the node, wherein the multiplexer also includes a second data input coupled to the internal channel, and wherein the multiplexer further includes an output;
- a sample and hold circuit including an input coupled to the output of the multiplexer, wherein the sample and hold circuit also includes a sample-trigger line and an output;
- a conversion logic circuit including an input coupled to the output of the sample and hold circuit, wherein the conversion logic circuit also includes a conversion-mode line, a conversion-done line, a reset line, and an output;
- a result register coupled to the output; and
- a sequencer circuit coupled to the sample-trigger line, the conversion-mode line, the conversion-done line, the reset line.

20. The device of claim 19, further comprising a configuration register including a request line, wherein the sequencer circuit is coupled to the request line, and wherein the configuration register also includes a first field indicating a conversion channel, a second field indicating a reference voltage source, and a third field indicating a sample period.

* * * * *